(12) United States Patent
Komatsu

(10) Patent No.: US 6,214,693 B1
(45) Date of Patent: Apr. 10, 2001

(54) PROCESS FOR THE PRODUCTION OF SEMICONDUCTOR DEVICE

(75) Inventor: Hiroshi Komatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/404,801

(22) Filed: Sep. 24, 1999

(30) Foreign Application Priority Data

Sep. 29, 1998 (JP) ................................................ 10-274568

(51) Int. Cl.$^7$ ...................................................... H01L 21/76
(52) U.S. Cl. ............................................. 438/406; 257/74
(58) Field of Search ................................... 438/588, 406, 438/455, 928; 257/74, 347, 508, 350

(56) References Cited

U.S. PATENT DOCUMENTS

| | | | |
|---|---|---|---|
| 5,629,242 | 5/1997 | Nagashima et al. | 438/692 |
| 6,063,686 | * 5/2000 | Masuda et al. | 438/406 |

* cited by examiner

*Primary Examiner*—Matthew Smith
*Assistant Examiner*—Calvin Lee
(74) *Attorney, Agent, or Firm*—Ronald P. Kananen; Rader, Fishman & Grauer

(57) ABSTRACT

A process for the production of a semiconductor device comprising the steps of; (a) forming a patterned mask layer on a surface of a semiconductor substrate, (b) etching the semiconductor substrate using the mask layer as an etching mask, to form a step between a portion of the semiconductor substrate covered with the mask layer and an etched portion of the semiconductor substrate, (c) forming an insulating film on the entire surface, and then planarizing the insulating film to cover the etched portion of the semiconductor substrate with the insulating film, (d) removing the mask layer, then, forming a first gate insulating film on an exposed surface of the semiconductor substrate, then forming a first gate electrode on the first gate insulating film, and at the same time, forming a first word line extending from the first gate electrode on the insulating film, (e) forming an interlayer on the entire surface, and bonding the semiconductor substrate and a supporting substrate to each other through the interlayer, (f) grinding and polishing the semiconductor substrate from its rear surface to expose a bottom surface of the insulating film and to leave a semiconductive layer which is the semiconductor substrate remaining after the polishing, surrounded by the insulating film, and (g) forming a second gate insulating film on an exposed surface of the semiconductive layer, then forming a second gate electrode on the second gate insulating film, and at the same time, forming a second word line extending from the second gate electrode on the insulating film.

4 Claims, 15 Drawing Sheets

[STEP-100]

[STEP-110]

[STEP-110] CONTINUED

[STEP-110] CONTINUED

[STEP-120]

[STEP-120] CONTINUED

[STEP-130]

[STEP-140]

[STEP-140] CONTINUED

[STEP-150]

[STEP-150] CONTINUED

[STEP-150] CONTINUED

[STEP-160]

[STEP-160] CONTINUED

[STEP-170]

[STEP-210]

[STEP-220]

[STEP-230]

[STEP-230] CONTINUED

[STEP-240]

[STEP-240] CONTINUED

[STEP—240] CONTINUED

[STEP—250]

[STEP-250] CONTINUED

[STEP-10]

[STEP-20]

[STEP-20] CONTINUED

[STEP-30]

[STEP-30] CONTINUED

[STEP-40]

[STEP—50]

PROCESS FOR THE PRODUCTION OF SEMICONDUCTOR DEVICE

BACKGROUND OF THE INVENTION AND RELATED ART STATEMENT

The present invention relates to a process for the production of a semiconductor device, and more specifically to a process for the production of a semiconductor device having a structure in which one gate electrode is formed above a channel-forming region and the other gate electrode is formed below the channel-forming region.

It is known that complete isolation of semiconductor devices can be achieved and "soft error" and a "latch-up" phenomenon which is inherent in CMOS transistors can be prevented by the formation of a semiconductor device in a semiconductive layer formed on an insulating layer. A semiconductor device formed in a semiconductive layer (to be called an "SOI" layer for convenience hereinafter) formed on an insulting layer will be referred to as an SOI (Silicon-On-Insulator) type semiconductor device. It has been studied since a relatively earlier time whether or not high-speed performance and high reliability of a semiconductor device can be accomplished by forming an SOI type semiconductor device (for example, CMOS transistors) in an approximately 0.5 µm thick SOI layer composed of, for example, silicon.

In recent years, the following has been found. The thickness of the semiconductive layer is adjusted to 100 nm or less, source/drain regions are formed in the entire region of the semiconductive layer in its thickness direction, and a portion of the semiconductive layer below a gate electrode is adjusted to have a relatively low impurity concentration, in order to bring the whole of the portion of the semiconductive layer into a depletion state. In this case, short channel effect can be suppressed, and current driving capacity of the semiconductor device can be improved. Further, high-speed performance of the semiconductor device can be achieved at a low supply voltage, so that a low power consumption can be materialized.

For example, when a MOS type field-effect transistor (to be sometimes referred to as "MOS-FET" hereinafter) is fabricated, one gate electrode is formed above a channel-forming region and the other gate electrode is formed below the channel-forming region, whereby short channel effect can be suppressed, a threshold voltage ($V_{th}$) and "swing" can be controlled, and further, there can be fabricated an X-MOS (MOS-FET which permits concurrent operation of the gate electrodes formed above and below the channel-forming region).

For forming a semiconductive layer on an insulating layer, a SIMOX (Separation by IMplanted OXygen) method or a so-called substrate-bonding method are known, while these methods have their merits and demerits. That is, the SIMOX method is excellent in uniformity of the SOI layer, while it has a defect that flatness of an interface between an insulating layer and a semiconductive layer is not so good. The substrate-bonding method shows excellent flatness of an interface between an insulating layer and a semiconductive layer, while it has a defect that it is difficult to form a uniform semiconductive layer having a particularly thin thickness.

The method of producing a semiconductor device structured to have gate electrodes formed above and below a channel-forming region according to a conventional substrate-bonding method will be explained with reference to FIGS. 12A, 12B, 13A, 13B, 14A, 14B and 15 hereinafter.

FIGS. 12A, 12B, 13A, 13B, 14A, 14B and 15 show schematic partial cross-sectional views of a silicon semiconductor substrate, and so forth when the silicon semiconductor substrate, and so forth are cut in the length direction of a gate electrode.

[Step-10]

First, a convex portion 10A is formed in a semiconductor substrate 10 composed of a silicon semiconductor substrate by lithography and etching processes. Then, an approximately 50 nm thick first insulating film 121 of $SiO_2$ is formed on the entire surface by a known thermal oxidation method. Then, a polycrystalline silicon (polysilicon) layer containing an impurity is formed on the entire surface by a known CVD method, and then, the polycrystalline silicon layer is patterned to form a first gate electrode 122 on the convex portion 10A of the semiconductor substrate 10. At the same time, a first word line 123 extending from the first gate electrode 122 is formed on the first insulating film 121. This state is shown in FIG. 12A. The first insulating film 121 formed on the surface of the convex portion 10A of the semiconductor substrate 10 also works as a first gate insulating film.

[Step-20]

An interlayer 16 is formed on the entire surface by a CVD method, and then the top surface of the interlayer 16 is planarized (see FIG. 12B). The interlayer 16 may have a two-layered structure, for example, an $SiO_2$ film and a polycrystalline silicon film formed thereon. The semiconductor substrate 10 and a supporting substrate 17 are bonded to each other through the interlayer 16 (see FIG. 13A). For example, the bonding is carried out under a condition of an oxygen gas atmosphere at 1100° C. for 30 minutes.

[Step-30]

Then, the semiconductor substrate 10 is ground and polished from its rear surface. Specifically, for leaving no grinding damage in the semiconductive layer, first, the semiconductor substrate 10 is mechanically ground with diamond grinding grains from its rear surface until the semiconductor substrate 10 comes to have a thickness of several µm on the first insulating film 121 (see FIG. 13B). Then, the semiconductor substrate 10 is selectively polished with a chemical/mechanical polishing method (CMP method) until the bottom 121A of the first insulating film 121 is exposed. The first insulating film 121 works as a polishing-stop layer, and a semiconductive layer 10B which is a remaining portion of the semiconductor substrate 10 is left as an SOI layer (see FIG. 14A).

[Step-40]

Then, a sacrificial oxide layer is formed on the surface of the semiconductive layer 10B by a thermal oxidation method, an ion-implanting mask is formed from a resist material, and the semiconductive layer 10B is ion-implanted for threshold voltage control. Then, the sacrificial oxide layer is removed with hydrofluoric acid. This state is shown in FIG. 14B.

[Step-50]

Then, a second insulating film i.e., a (second gate insulating film 124) is formed on the surface of the semiconductive layer 10B by a thermal oxidation method. Then, a polycrystalline silicon layer containing an impurity is formed on the entire surface by a known CVD method, and the polycrystalline silicon layer is patterned to form a second gate electrode 125 on the semiconductive layer 10B through the second gate insulating film 124. At the same time, a second word line 126 extending from the second gate electrode 125 is formed on the first insulating film 121. This state is shown in FIG. 15.

In the above-produced semiconductor device, an integration degree thereof can be more significantly improved since it has a structure in which semiconductor device elements are formed below the semiconductive layer 10B, and the thickness of the semiconductive layer 10B can be determined with a relatively high degree of freedom since the thickness of the semiconductive layer 10B can be defined by the height of the convex portion 10A formed in the semiconductor substrate 10.

In the semiconductor device produced according to the above steps, the first word line 123 which is an extending portion from the first gate electrode 122 and the second word line 126 which is an extending portion from the second gate electrode 125 face each other through the first insulating film 121. Generally, the first insulating film 121 has a thickness $t_0$ (see FIG. 14A) of approximately 50 nm when it is formed. In [step-40], the sacrificial oxide layer is formed on the surface of the semiconductive layer 10B, and after ion implantation is carried out, the sacrificial oxide layer is removed with hydrofluoric acid. As a result, the thickness $t_1$ (see FIG. 14B) of the first insulating film 121 is decreased to approximately 10 nm.

With the above decrease in the thickness of the first insulating film 121, there is caused a problem that parasitic capacitance in a portion where the first word line 123 and the second word line 126 face each other increases, so that operation speed of the semiconductor device decreases.

In the production of the above semiconductor device, the convex portion 10A is formed in the semiconductor substrate 10 in [Step-10]. There is another method in which an oxide layer is formed on a surface region of a silicon semiconductor substrate by a selective oxidation method (LOCOS method), then, a region of a silicon semiconductor substrate surrounded by the oxide layer is left by a substrate-bonding method, as a semiconductive layer. In this method, the oxide layer is formed as one having a large thickness by a selective oxidation method. However, there is a problem that a critical dimension loss is large when the above oxide layer is formed. Further, there is another problem that the eventual semiconductive layer is liable to have defects since the semiconductive layer has a stress due to the formation of the oxide layer. The SOI type semiconductor device is being employed for LSIs of a next generation and generations thereafter, while it is a serious problem that the critical dimension loss is large. Further, thickness of the semiconductive layer is determined depending upon the thickness of the oxide layer, and it is difficult in many cases to form a semiconductive layer having a thin thickness.

OBJECT AND SUMMARY OF THE INVENTION

It is therefore a first object of the present invention to provide a process for the production of a semiconductor device having a structure in which one gate electrode is formed above a channel-forming region, the other gate electrode is formed below the channel-forming region, word lines which are extending portions from the gate electrodes face each other through an insulating film, and the above process can overcome the problem that parasitic capacitance in a portion where the word lines faces each other increases so that the operation speed of the semiconductor device decreases.

It is a second object of the present invention to provide a process for the production of a semiconductor device having a structure in which one gate electrode is formed above a channel-forming region, the other gate electrode is formed below the channel-forming region, word lines which are extending portions from the gate electrodes face each other through an insulating film, and the above process can overcome the problem that a critical dimension loss is large when an oxide layer is formed by a selective oxidation method.

The process for the production of a semiconductor device according to a first aspect of the present invention for achieving the above first object comprises the steps of;

(a) forming a patterned mask layer on a surface of a semiconductor substrate, (b) etching the semiconductor substrate with using the mask layer as an etching mask, to form a step between a portion of the semiconductor substrate covered with the mask layer and an etched portion of the semiconductor substrate, (c) forming an insulating film on the entire surface, and then planarizing the insulating film to cover the etched portion of the semiconductor substrate with the insulating film, (d) removing the mask layer, then, forming a first gate insulating film on an exposed surface of the semiconductor substrate, then forming a first gate electrode on the first gate insulating film, and at the same time, forming a first word line extending from the first gate electrode on the insulating film, (e) forming an interlayer on the entire surface, and bonding the semiconductor substrate and a supporting substrate to each other through the interlayer, (f) grinding and polishing the semiconductor substrate from its rear surface to expose a bottom surface of the insulating film and to leave a semiconductive layer which is the semiconductor substrate remaining after the polishing, surrounded by the insulating film, and (g) forming a second gate insulating film on an exposed surface of the semiconductive layer, then forming a second gate electrode on the second gate insulating film, and at the same time, forming a second word line extending from the second gate electrode on the insulating film.

In the process for the production of a semiconductor device according to the first aspect of the present invention, preferably, the mask layer has a two-layered structure formed of a silicon oxide film ($SiO_2$ film) and a silicon nitride film (SiN film) formed on the silicon oxide film. Further, preferably, the insulating film is a silicon oxide film ($SiO_2$ film) and is formed by a chemical vapor deposition method (CVD method).

The process for the production of a semiconductor device according to a second aspect of the present invention for achieving the above second object comprises the steps of;

(a) forming a patterned mask layer on a semiconductor substrate, (b) etching the semiconductor substrate with using the mask layer as an etching mask, to form a step between a portion of the semiconductor substrate covered with the mask layer and an etched portion of the semiconductor substrate, (c) selectively oxidizing the surface of the etched portion of the semiconductor substrate to form an oxide layer, (d) removing the mask layer, then, forming a first gate insulating film on an exposed surface of the semiconductor substrate, forming a first gate electrode on the first gate insulating film, and at the same time, forming a first word line extending from the first gate electrode on the oxide layer, (e) forming an interlayer on the entire surface, and bonding the semiconductor substrate and a supporting substrate to each other through the interlayer, (f) grinding and polishing the semiconductor substrate from its rear surface to expose a bottom surface of the oxide layer and to leave a semiconductive layer which is the semiconductor substrate remaining after the polishing, surrounded by the oxide layer, and (g) forming a second gate insulating film on an exposed surface of the semiconductive layer, then forming a second gate electrode on the second gate insulating film, and at the same time, forming a second word line extending from the second gate electrode on the oxide layer.

In the process for the production of a semiconductor device according to the second aspect of the present invention, preferably, the mask layer has a two-layered structure formed of a silicon oxide film ($SiO_2$ film) and a silicon nitride film (SiN film) formed on the silicon oxide film. Further, preferably, the oxide layer is formed by carrying out selective thermal oxidation of the surface of the etched portion of the semiconductor substrate.

In the process for the production of a semiconductor device according to the first aspect of the present invention, the semiconductor substrate is etched to form a convex portion and a concave portion in the semiconductor substrate, the concave portion is filled with the insulating film, and the word lines are formed on and underneath the insulating film. Therefore, even if the insulating film is etched, the insulating film having a sufficient thickness can be finally secured, and an increase in parasitic capacitance in a portion where the first word line and the second word line face each other can be prevented. Further, the thickness of the semiconductive layer is defined by the step formed in the semiconductor substrate, so that the semiconductive layer can be easily formed as one having a thin thickness.

In the process for the production of a semiconductor device according to the second aspect of the present invention, the semiconductor substrate is etched to form a convex portion and a concave portion in the semiconductor substrate, and the oxide layer is formed in the concave portion by a selective oxidation method. The thickness of the oxide layer can be therefore decreased, and the critical dimension loss of the semiconductive layer caused by the formation of the oxide layer can be therefore relatively minimized. Further, the step is formed in the semiconductor substrate, so that the semiconductive layer can be easily formed as one having a thin thickness finally.

BRIEF DESCRIPTION OF THE DRAWINGS

The present invention will be explained in detail with reference to drawings hereinafter.

FIG. 10B is a schematic partial cross-sectional view of the semiconductor substrate, for explaining the process for the production of a semiconductor device in Example 2.

FIG. 14B is a schematic partial cross-sectional view of the semiconductor substrate, for explaining the process for the production of the conventional semiconductor device.

DESCRIPTION OF THE PREFERRED EMBODIMENTS

Example 1

Figure 1A:
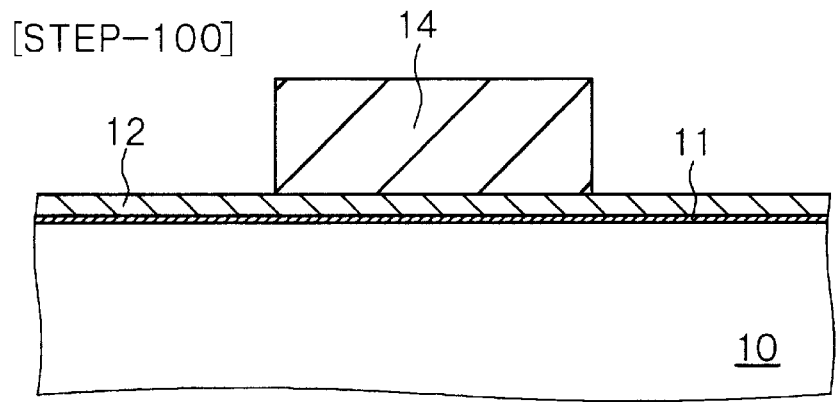
FIGS. 1A, 1B and 1C are schematic partial cross-sectional views of a semiconductor substrate, for explaining a process for the production of a semiconductor device in Example 1.
Figure 1B:
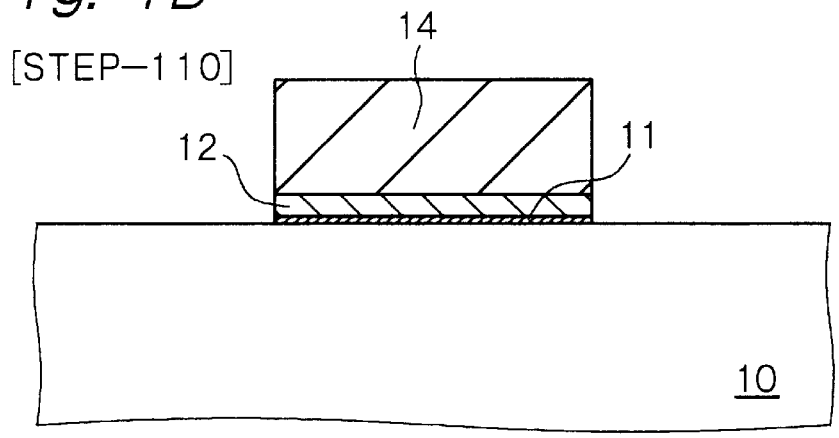

Example 1 is concerned with a process for the production of a semiconductor device according to the first aspect of the present invention. That is, the process includes the steps of etching a semiconductor substrate to form a convex portion and a concave portion in the semiconductor substrate and filling the concave portion with an insulating film. The process for the production of a semiconductor device in Example 1 will be explained with reference to the steps shown in FIGS. 1A, 1B, 1C, 2A, 2B, 2C, 3A, 3B, 3C, 4A, 4B, 5A, 5B, 6A and 6B showing schematic partial cross-sectional views of a semiconductor substrate, hereinafter. In addition, FIGS. 1A, 1B, 1C, 2A, 2B, 2C, 3A, 3B, 3C, 4A, 4B, 5A and 6A are schematic partial cross-sectional views of a semiconductor substrate, taken by cutting them along the length direction of a gate electrode, and FIG. 6B is a schematic partial cross-sectional view of the semiconductor substrate, taken by cutting them along the width direction of a gate electrode.

[Step-100]

First, a patterned mask layer 13 is formed on a semiconductor substrate 10 composed of a silicon semiconductor substrate. The mask layer 13 has a two-layered structure formed of a silicon oxide film (pad oxide film 11) and a silicon nitride film (SiN film) 12 formed thereon. Specifically, an approximately 10 nm thick pad oxide film 11 composed of $SiO_2$ is formed on the surface of the semiconductor substrate 10 by a thermal oxidation method, and then an approximately 200 nm nitride film 12 composed of SiN is formed on the entire surface by a CVD method. A mask 14 composed of a resist material is formed on the nitride film 12 by a lithographic method (see FIG. 1A). The pad oxide film 11 is formed for decreasing a stress between the semiconductor substrate 10 and the nitride film 12 and for reliably etching the nitride film 12. A semiconductor device is to be formed in a portion of the semiconductor substrate 10 below the mask layer 13.

[Step-110]

Figure 1C:
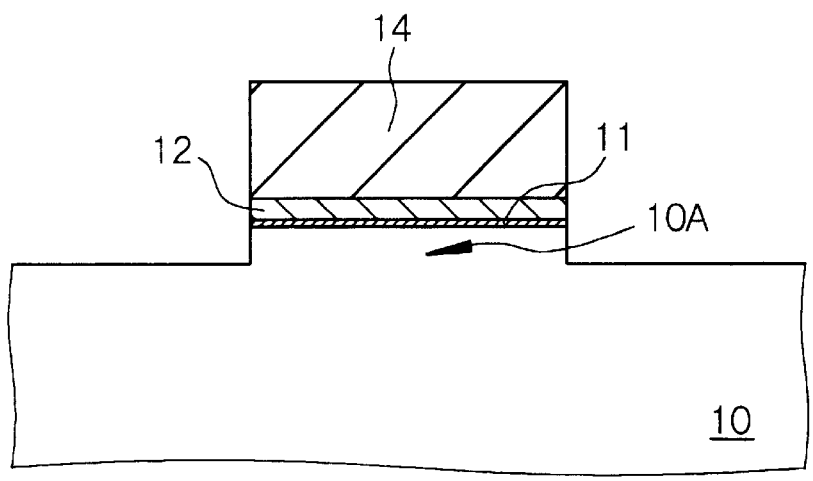

Then, the nitride film 12 and the pad oxide film 11 are etched by an RIE method using the mask 14 as an etching mask (see FIG. 1B), and further, the semiconductor substrate 10 is etched with using the mask layer 13 as an etching mask, to form a step between a portion of the semiconductor substrate 10 (convex portion 10A) covered with the mask layer 13 and an etched portion (concave portion) of the semiconductor substrate 10 (see FIG. 1C). The step has a height of, for example, approximately 100 nm. The eventual thickness of a semiconductive layer where a semiconductor device is to be formed is defined by the height of the step (height of the convex portion 10A). The following Table 1 shows an example of a condition of etching the pad oxide film 11 and the semiconductor substrate 10 with a magnetron RIE apparatus. Then, the mask 14 is removed by ashing treatment (see FIG. 2A).

TABLE 1

| Gas | $CHF_3/CO$ = 60/240 sccm |
|---|---|
| Pressure | 7.9 Pa |
| Power | 1.45 kw |

[Step-120]

Figure 2A:
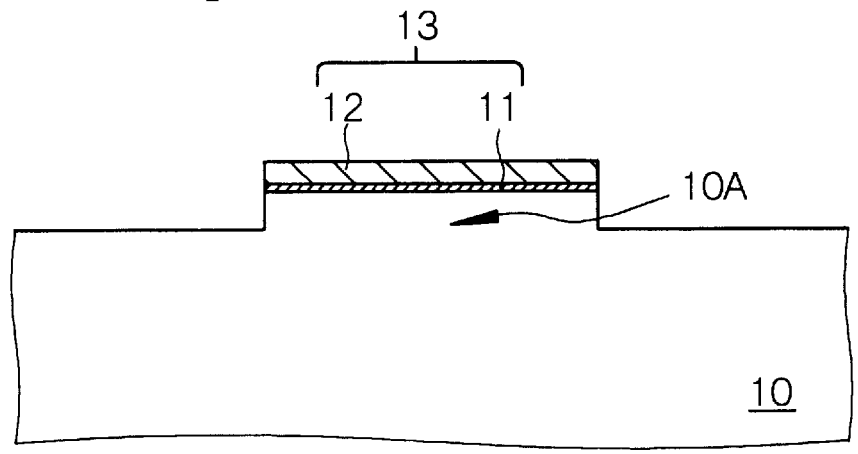
FIGS. 2A, 2B and 2C following FIG. 1C are schematic partial cross-sectional views of the semiconductor substrate, for explaining the process for the production of a semiconductor device in Example 1.
Figure 2B:
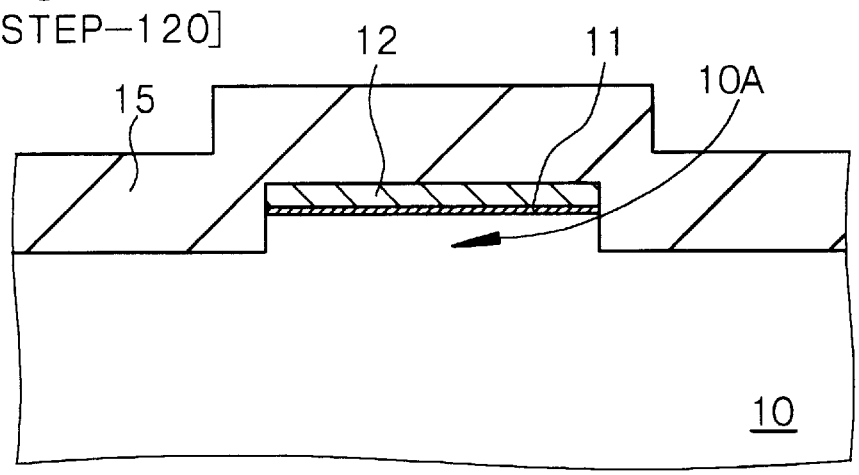
Figure 2C:
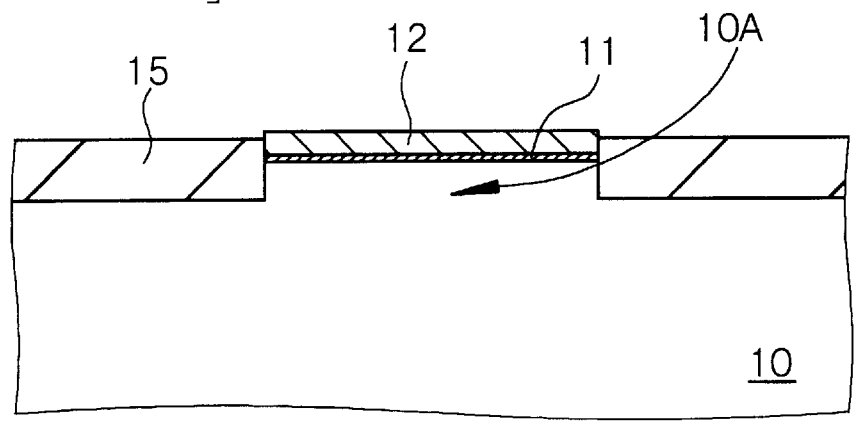

An approximately 0.3 $\mu$m thick insulating film 15 composed of $SiO_2$ is deposited on the entire surface by a CVD method (see FIG. 2B), and then, the insulating film 15 is planarized, e.g., by a CMP method, to cover the etched portion of the semiconductor substrate 10 with the insulating film 15 (see FIG. 2C). In the planarization of the insulating film 15, the nitride film 12 works as a polishing-stop layer. For the planarization of the insulating film 15, there may be used a method disclosed, for example, in JP-A-7-245306.

[Step-130]

Then, the mask layer 13 is removed. Specifically, the nitride film 12 is removed by a wet etching method using hot phosphoric acid, and then the pad oxide film 11 is removed by a wet etching method using hydrofluoric acid, whereby a structure shown in FIG. 3A can be obtained. In the above manner, the convex portion 10A of the semiconductor substrate 10 is in a state where it is surrounded by the insulating film 15.

[Step-140]

Figure 3A:
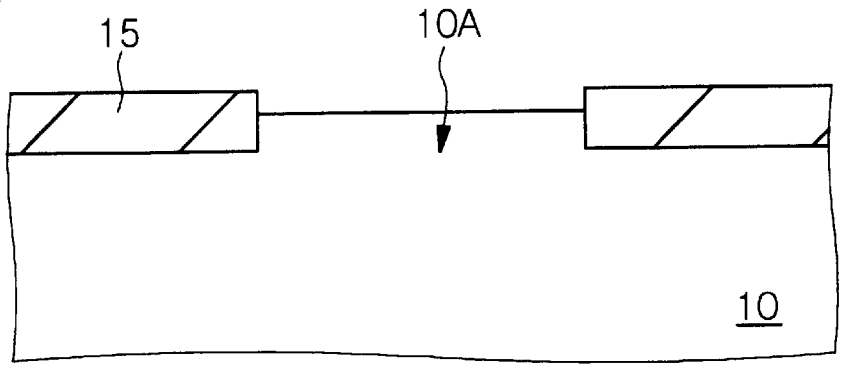
FIGS. 3A, 3B and 3C following FIG. 2C are schematic partial cross-sectional views of the semiconductor substrate, for explaining the process for the production of a semiconductor device in Example 1.
Figure 3B:
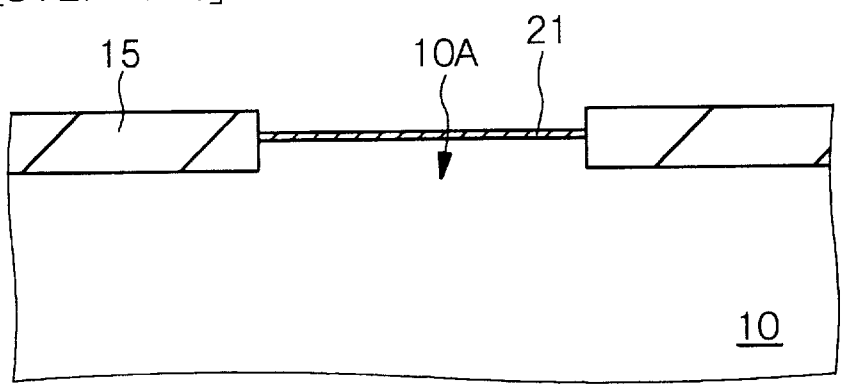
Figure 3C:
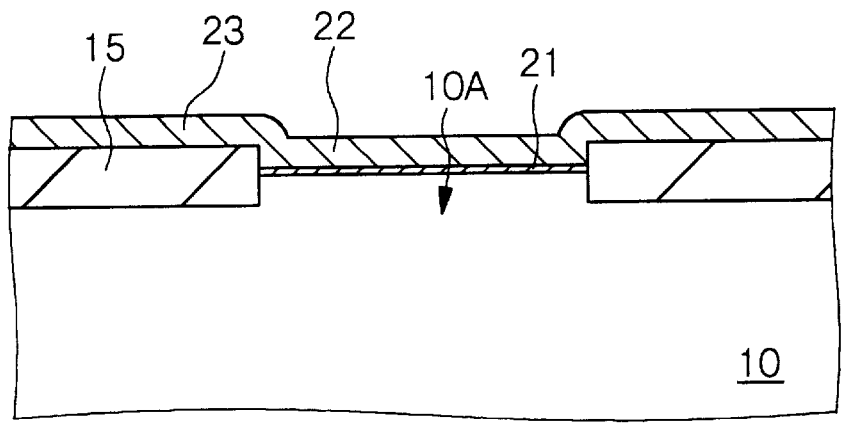
Figure 4A:
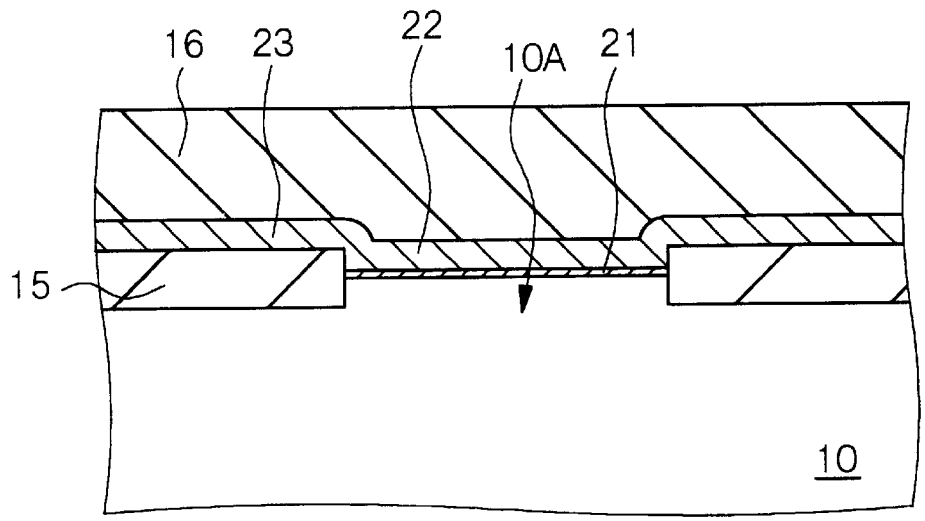
FIGS. 4A and 4B following FIG. 3C are schematic partial cross-sectional views of the semiconductor substrate, for explaining the process for the production of a semiconductor device in Example 1.
Figure 4B:
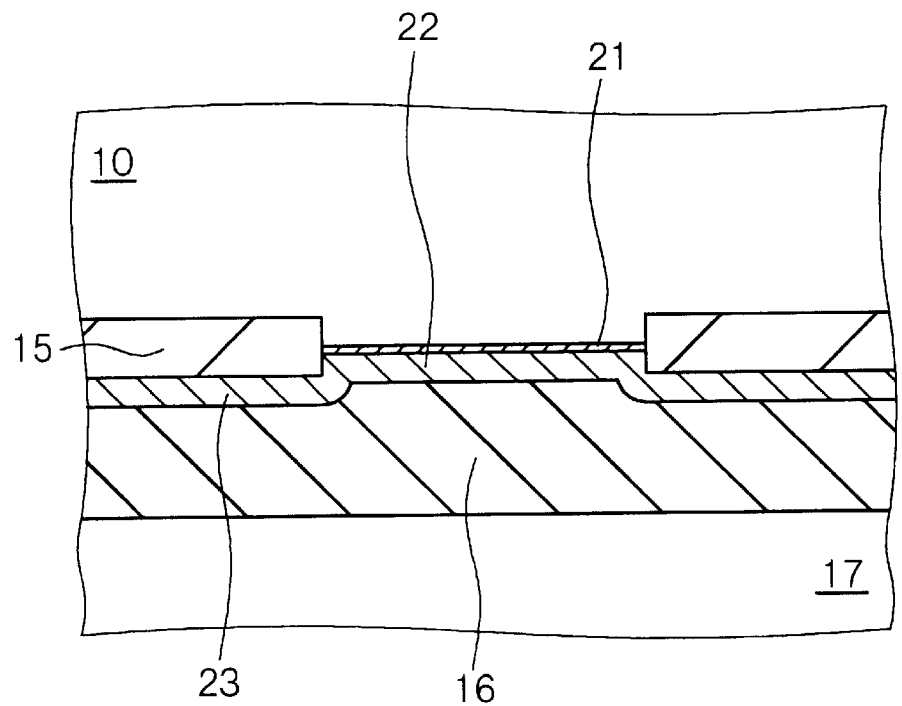

Then, a first gate insulating film 21 is formed on an exposed surface of the semiconductor substrate 10 (convex portion 10A) by a thermal oxidation method or by a combination of a thermal oxidation method and a thermal nitriding method (see FIG. 3B). Then, a polycrystalline silicon layer containing an impurity is formed on the entire surface by a CVD method, and the polycrystalline silicon layer is patterned to form a first gate electrode 22 on the first gate insulating film 21. At the same time, a first word line 23 extending from the first gate electrode 22 is formed on the insulating film 15. In the above manner, a structure shown in FIG. 3C can be obtained.

[Step-150]

Then, an interlayer 16 is formed on the entire surface, and the semiconductor substrate 10 and a supporting substrate 17 are bonded to each other through the interlayer 16. In Example 1, the interlayer 16 has a two-layered structure formed of an $SiO_2$ film and a polycrystalline silicon film formed thereon. Specifically, the $SiO_2$ film is formed on the entire surface by a CVD method, then, the polycrystalline film is formed on the entire surface by a CVD method, and the top surface of the polycrystalline silicon film is planarized (see FIG. 4A). Then, the semiconductor substrate 10 and the supporting substrate 17 are bonded to each other through the interlayer 16 (see FIG. 4B). The above bonding is carried out, for example, under a condition of an oxygen gas atmosphere at 1100° C. for 30 minutes.

Then, the semiconductor substrate 10 is ground and polished from its rear surface. Specifically, for leaving no grinding damage on the semiconductive layer, first, the semiconductor substrate 10 is mechanically ground, for example, with diamond grains from its rear surface until the semiconductor substrate 10 is left as one having a thickness of several $\mu$m above a bottom 15A of the insulating film 15. Then, the semiconductor substrate 10 is selectively polished by a chemical/mechanical polishing method (CMP method) until the bottom surface 15A of the insulating film 15 is exposed. The insulating film 15 works as a polishing-stop layer, and a semiconductive layer 10B, which is a remaining portion of the semiconductor substrate 10 (remainder after polishing), surrounded by the insulating film 15 is left as an SOI layer (see FIG. 5A).

[Step-160]

Then, a sacrificial oxide layer is formed on the surface of the semiconductive layer 10B by a thermal oxidation method, an ion-implanting mask is formed from a resist material, and the semiconductive layer 10B is ion-implanted for controlling a threshold voltage. Then, the sacrificial oxide layer is removed with hydrofluoric acid. When the sacrificial oxide layer is removed, the insulating film 15 is also etched. Since, however, the insulating film 15 has a sufficient thickness, the remaining insulating film 15 still has a sufficient thickness. Therefore, an increase in parasitic capacitance in a portion where the first word line and the second word line face each other can be prevented.

Figure 5A:
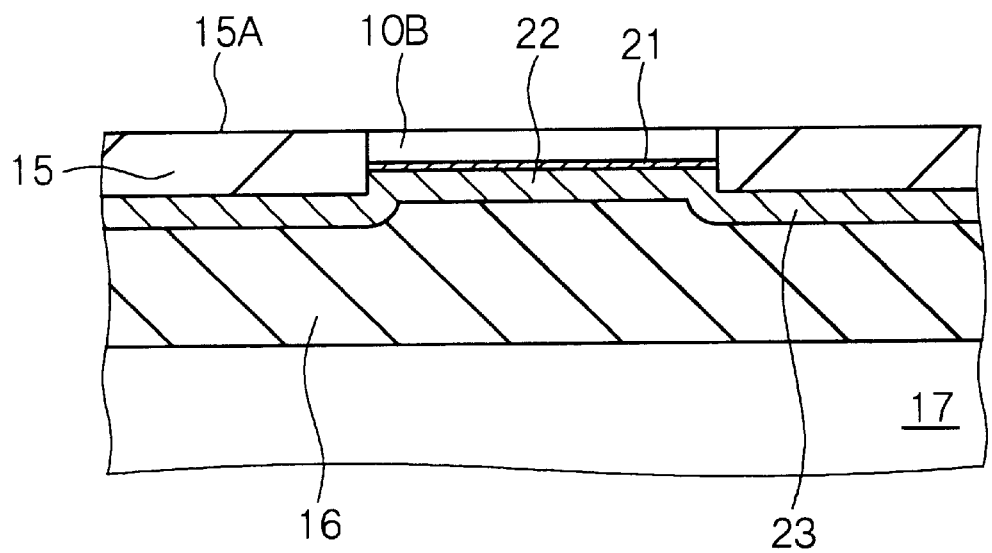
FIGS. 5A and 5B following FIG. 4B are schematic partial cross-sectional views of the semiconductor substrate, for explaining the process for the production of a semiconductor device in Example 1.
Figure 5B:
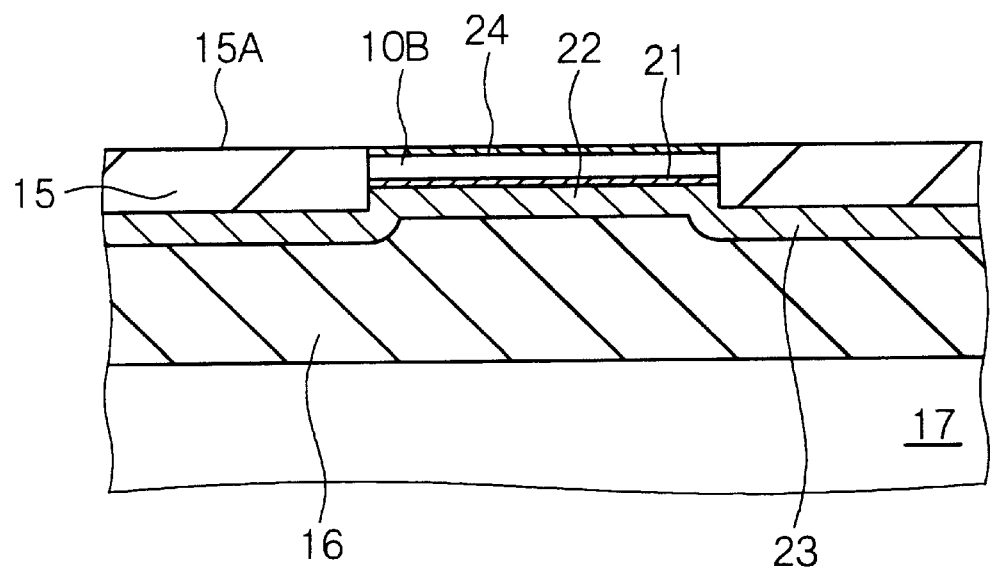
Figure 6A:
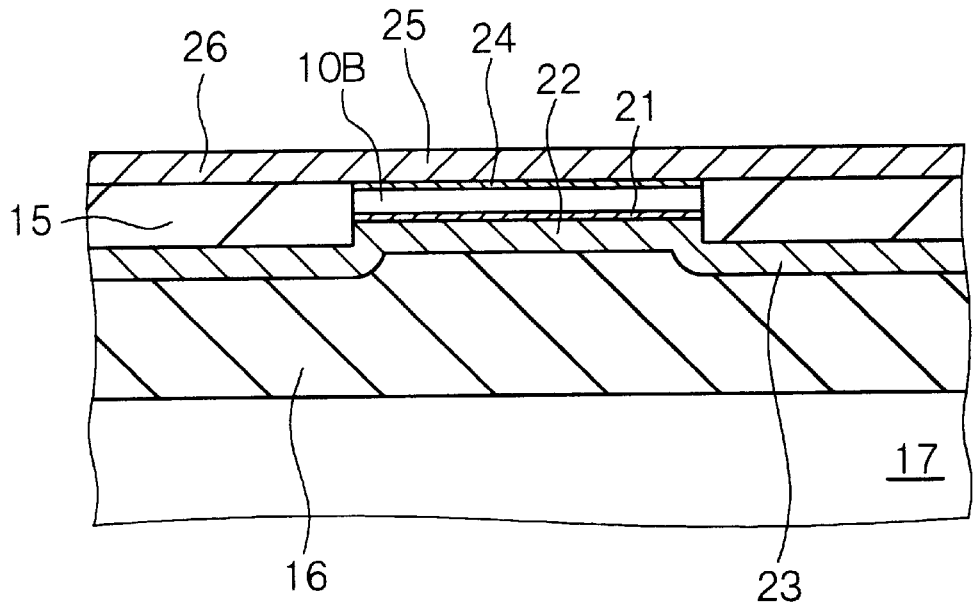
FIGS. 6A and 6B following FIG. 5B are schematic partial cross-sectional views of the semiconductor substrate, for explaining the process for the production of a semiconductor device in Example 1.
Figure 6B:
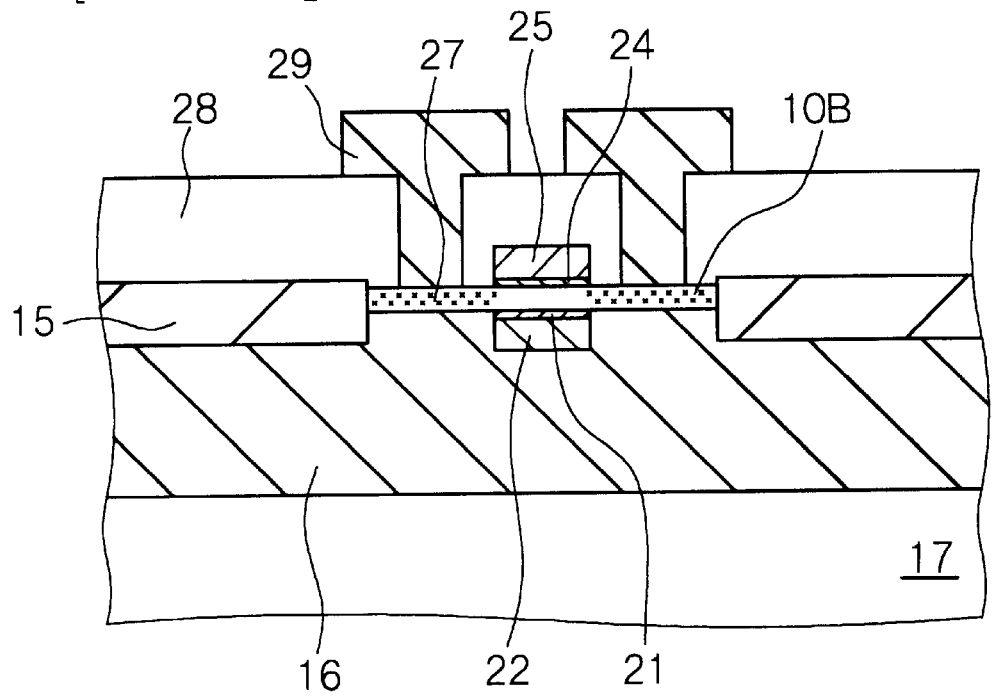

Then, a second gate insulating film 24 is formed on an exposed surface of the semiconductive layer 10B by a thermal oxidation method or by a combination of a thermal oxidation method and a thermal nitriding method (see FIG. 5B). A polycrystalline silicon layer containing an impurity is formed on the entire surface by a CVD method, and then, the polycrystalline silicon layer is patterned to form a second gate electrode 25 on the second insulating film 24. At the same time, a second word line 26 extending from the second gate electrode 25 is formed on the insulating film 15. In this manner, a structure shown in FIG. 6A can be obtained.

[Step-170]

Then, a MOS-FET is completed according to a known method. Specifically, the semiconductive layer 10B is ion-implanted to form source/drain regions 27 in the semiconductive layer 10B entirely in the thickness direction of the semiconductive layer 10B. Then, an insulating interlayer 28 is formed on the entire surface by a CVD method, and opening portions are formed in the insulating interlayer 28 above the source/drain regions 27. A wiring material layer is formed on the insulating interlayer 28 including the interiors of the opening portions, and the wiring material layer is patterned to form wirings 29 on the insulating interlayer 28. In this manner, a semiconductor device having a structure shown in FIG. 6B can be completed.

EXAMPLE 2

Example 2 is concerned with a process for the production of a semiconductor device according to the second aspect of the present invention. That is, the process includes the steps of etching a semiconductor substrate to form a convex portion and a concave portion in the semiconductor substrate and forming an oxide layer in the concave portion by a selective oxidation method (LOCOS method). The process for the production of a semiconductor device in Example 2 will be explained with reference to the steps respectively shown in FIGS. 7A, 7B, 8A, 8B, 9A, 9B, 10A, 10B and 11 showing schematic partial cross-sectional views of a semiconductor substrate, hereinafter. In addition, FIGS. 7A, 7B, 8A, 8B, 9A, 9B, 10A, 10B and 11 are schematic partial cross-sectional views of a semiconductor substrate, taken by cutting them along the length direction of a gate electrode.

[Step-200]

First, a patterned layer 13 is formed on the surface of a semiconductor substrate 10 composed of a silicon semiconductor substrate in a step similar to [Step-100] in Example 1. The semiconductor substrate 10 is etched with using the mask layer 13 as an etching mask, to form a step between a portion of the semiconductor substrate (convex portion 10A) covered with the mask layer 13 and an etched portion (concave portion) of the semiconductor substrate 10, whereby a structure shown in FIG. 2A can be obtained.

[Step-210]

Figure 7A:
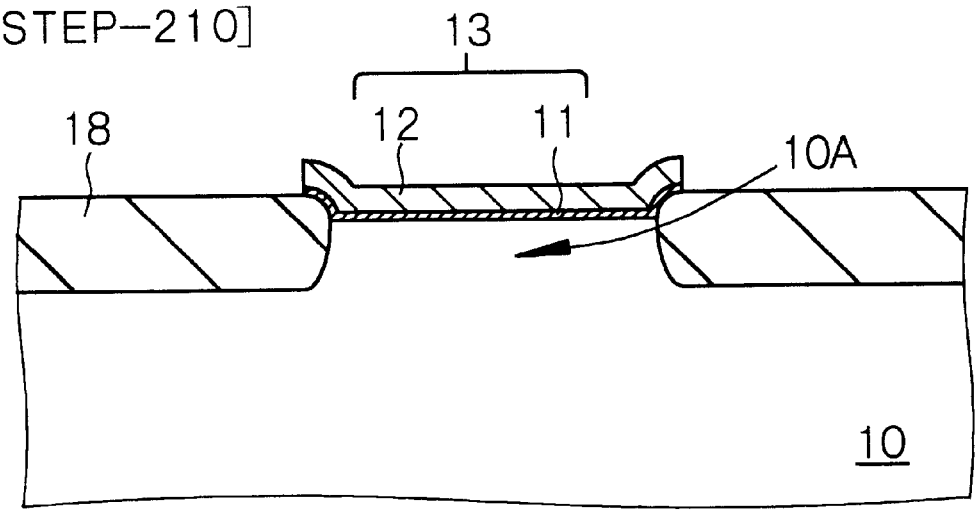
FIGS. 7A and 7B are schematic partial cross-sectional views of a semiconductor substrate, for explaining a process for the production of a semiconductor device in Example 2.
Figure 7B:
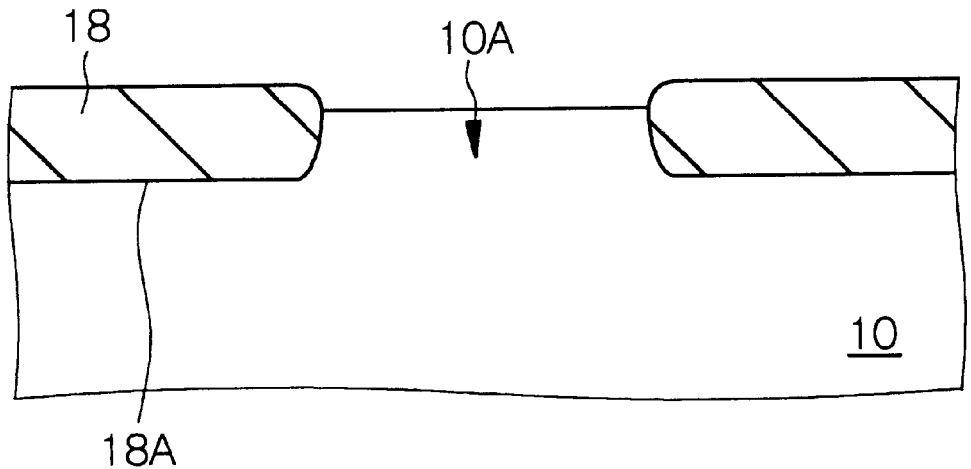

Then, the surface of the etched portion of the semiconductor substrate 10 is selectively oxidized to form an oxide layer 18 (see FIG. 7A). The oxide layer may have a thickness of approximately 0.2 µm. The thickness of the oxide layer 18 can be thinner than the thickness (approximately 0.4 µm) of an isolation region having a conventional LOCOS structure since it has no influence on a device isolation characteristic of an SOI type semiconductor device. Therefore, the critical dimension loss of the semiconductive layer caused by the formation of the oxide layer 18 can be relatively decreased. Further, the thickness of the semiconductive layer can be decreased.

For further decreasing parasitic capacitance in a portion where the first word line and the second word line face each other, it may be required to increase the thickness of the oxide layer 18. For this purpose, prior to [Step-210], it is sufficient to form a side-wall on the side wall of the mask layer 13 by depositing an SiN layer on the entire surface by a CVD method and etching the SiN layer by an RIE method. When the above side-wall is formed, the oxidation of the side wall of the convex portion 10A of the semiconductor substrate 10 can be suppressed, and as a result, the critical dimension loss can be decreased.

[Step-220]

Then, the mask layer 13 is removed. Specifically, the nitride film 12 is removed by a wet etching method using hot phosphoric acid and then the pad oxide film 11 is removed by a wet etching method using hydrofluoric acid, whereby a structure shown in FIG. 7B can be obtained. The convex portion 10A of the semiconductor substrate 10 is in a state where it is surrounded by the oxide layer 18. If the oxide layer has a thickness of approximately 0.2 µm, the distance (length) from the top surface of the convex portion 10A of the semiconductor substrate to the bottom surface 18A of the oxide layer 18, measured along the perpendicular direction, is approximately 0.1 µm, and the above distance (length) corresponds to the thickness of a semiconductive layer 10B to be formed later.

[Step-230]

Figure 8A:
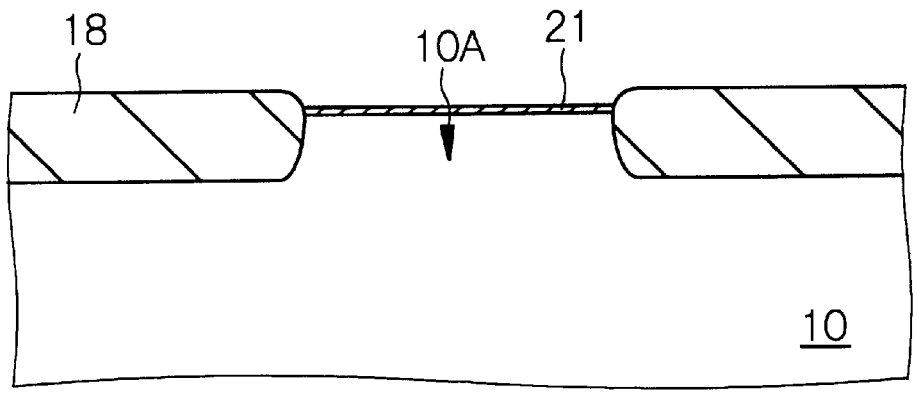
FIGS. 8A and 8B following FIG. 7B are schematic partial cross-sectional views of the semiconductor substrate, for explaining the process for the production of a semiconductor device in Example 2.
Figure 8B:
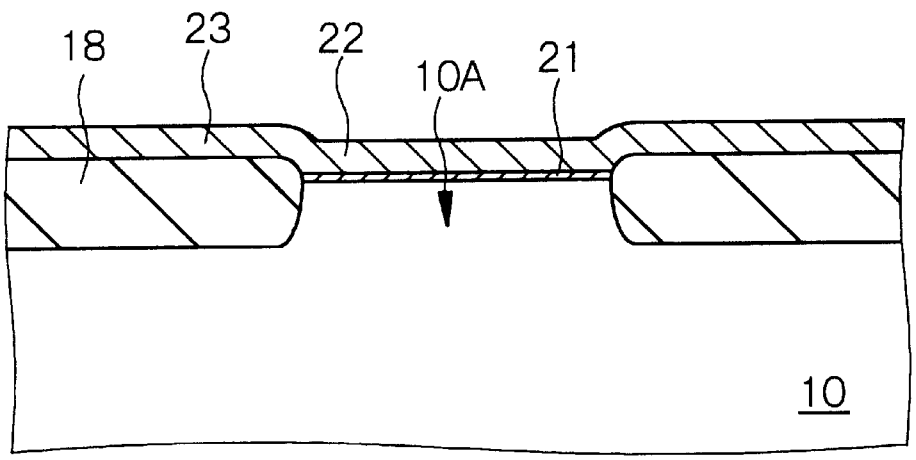

Then, as seen in FIGS. 8A and 8B a first insulating film 21 is formed on an exposed surface of the semiconductor substrate 10 (convex portion 10A) by a thermal oxidation method or by a combination of a thermal oxidation method and a thermal nitriding method (see FIG. 8A). A polycrystalline silicon layer containing an impurity is formed on the entire surface by a CVD method, and then the polycrystalline silicon layer is patterned to form a first gate electrode 22 on the first gate insulating film 21. At the same time, a first word line 23 extending from the first gate electrode 22 is formed on the oxide layer 18, whereby a structure shown in FIG. 8B can be obtained.

[Step-240]

Figure 9A:
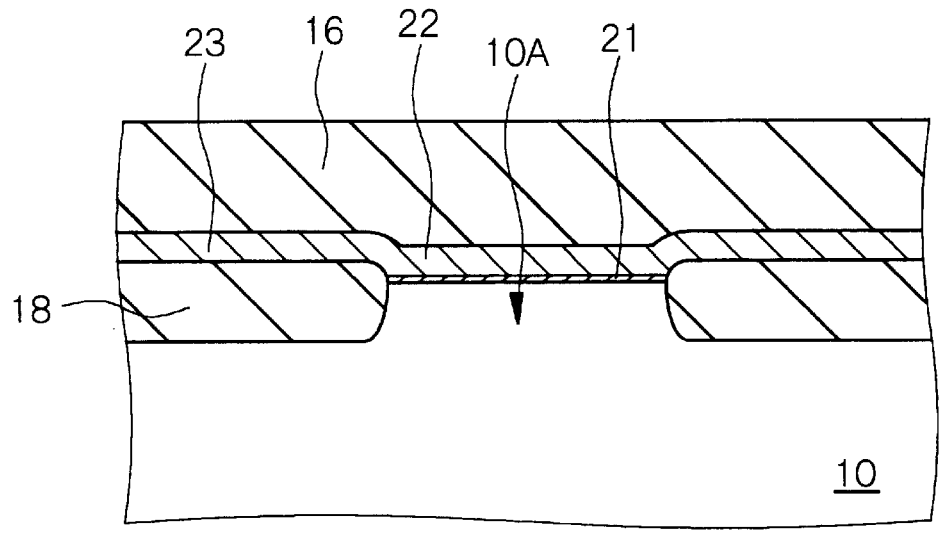
FIGS. 9A and 9B following FIG. 8B are schematic partial cross-sectional views of the semiconductor substrate, for explaining the process for the production of a semiconductor device in Example 2.
Figure 9B:
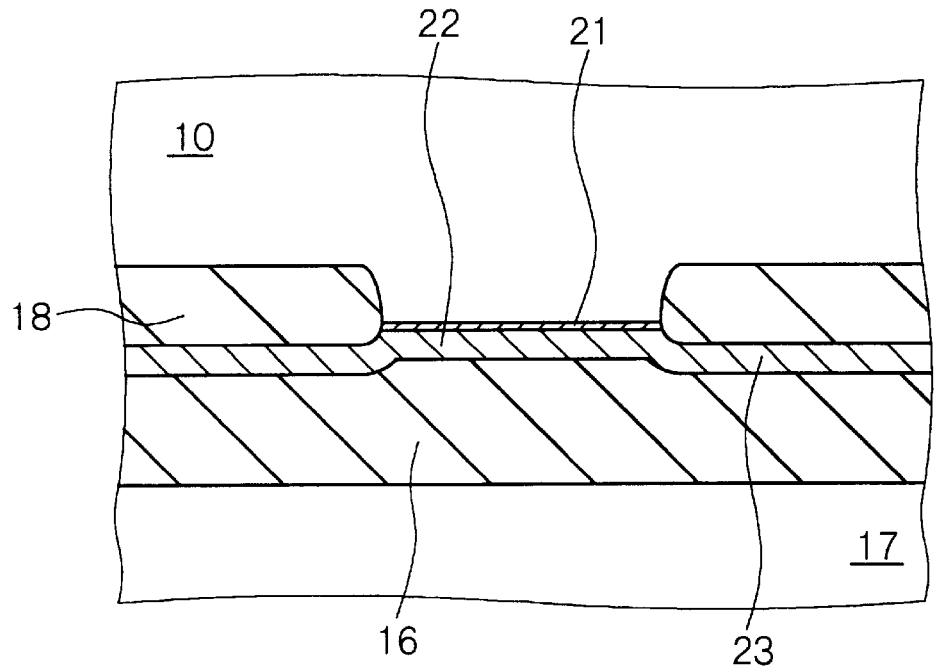
Figure 10A:
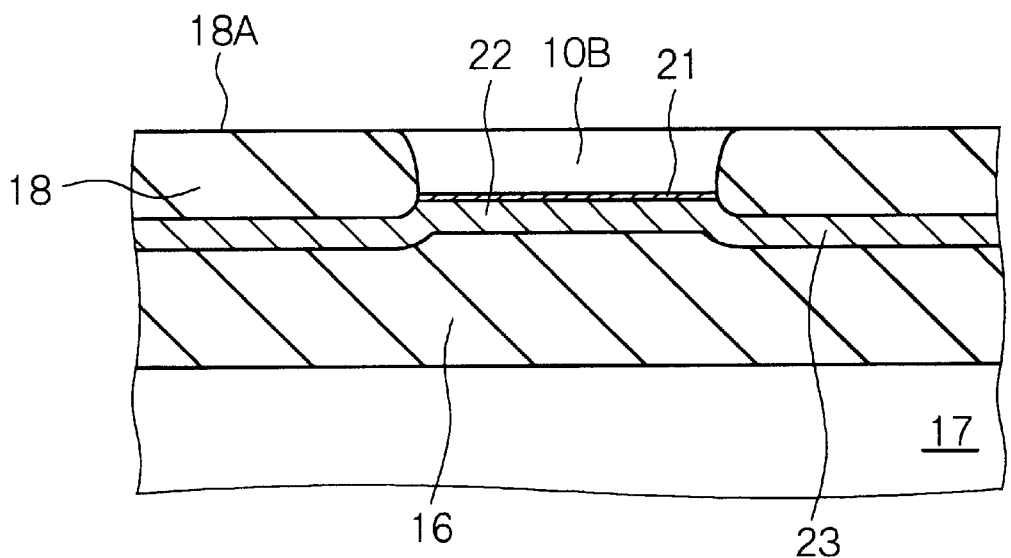
FIGS. 10A and 10B following FIG. 9B are schematic partial cross-sectional views of the semiconductor substrate, for explaining the process for the production of a semiconductor device in Example 2.

Then, as seen in FIGS. 9A, 9B, and 10A, an interlayer 16 is formed on the entire surface, and the semiconductor substrate 10 and a supporting substrate 17 are bonded to each other through the interlayer 16. In Example 2, the interlayer 16 also has a two-layered structure formed of an SiO$_2$ film and a polycrystalline silicon film formed thereon. Specifically, an SiO$_2$ film is formed on the entire surface by a CVD method, then, a polycrystalline silicon film is formed on the entire surface by a CVD method, and the top surface of the polycrystalline silicon film is planarized (see FIG. 9A). Then, the semiconductor substrate 10 and the supporting substrate 17 are bonded to each other through the interlayer 16 (see FIG. 9B). The above bonding is carried out, for example, under a condition of an oxygen gas atmosphere at 1100° C. for 30 minutes.

Then, the semiconductor substrate 10 is ground and polished from its rear surface. Specifically, for leaving no grinding damage on the semiconductive layer, first, the semiconductor substrate 10 is mechanically ground, for example, with diamond grains from its rear surface until the semiconductor substrate 10 is left as one having a thickness of several µm above a bottom surface 18A of the oxide layer 18. Then, the semiconductor substrate 10 is selectively polished by a chemical/mechanical polishing method (CMP method) until the bottom surface 18A of the oxide layer 18 is exposed. The oxide layer 18 works as a polishing-stop layer, and a semiconductive layer 10B, which is a remaining portion of the semiconductor substrate 10 (remainder after polishing), surrounded by the oxide layer 18 is left as an SOI layer (see FIG. 10A).

[Step-250]

Figure 10B:
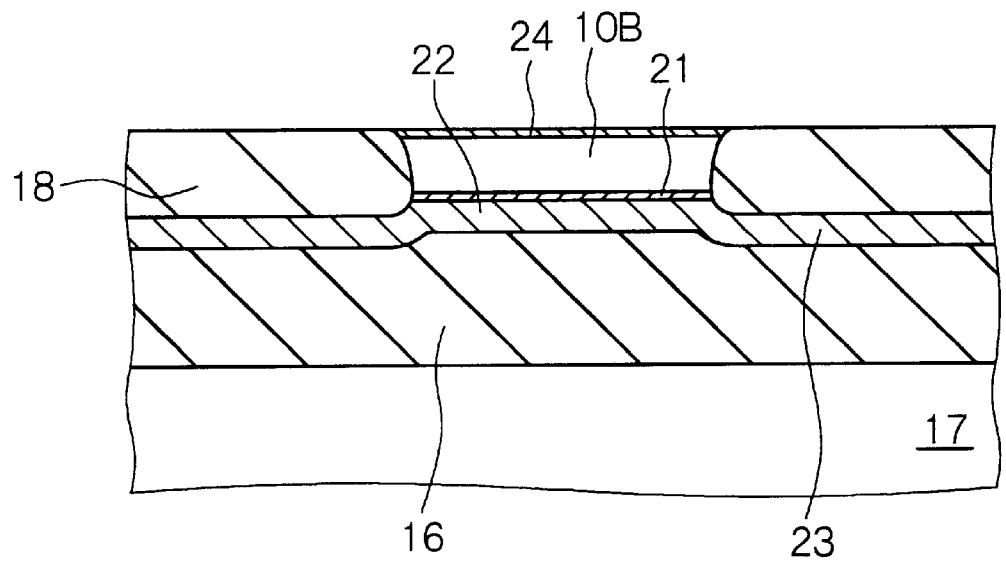
Figure 11:
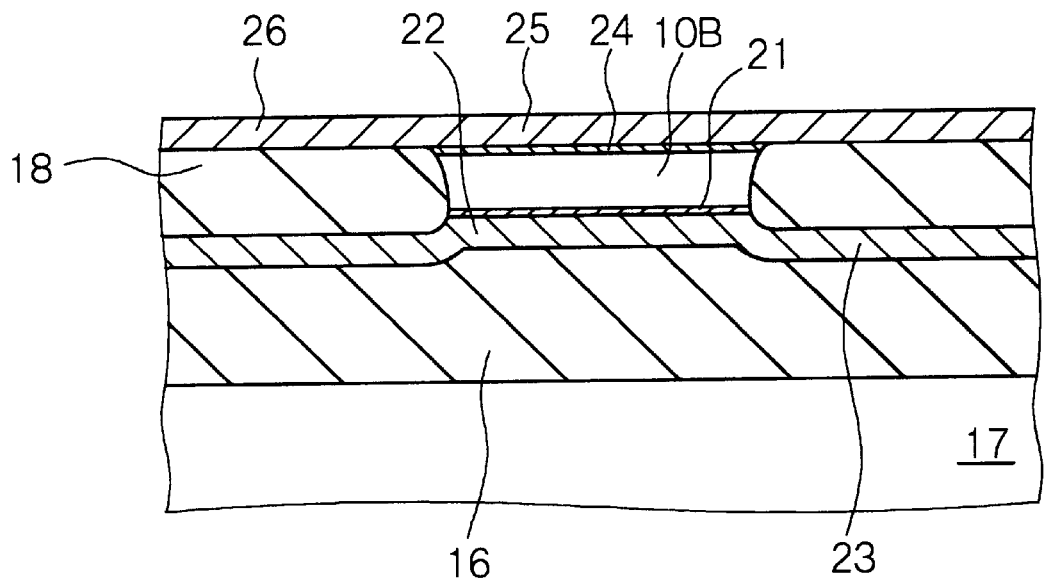
FIG. 11 following
Figure 12A:
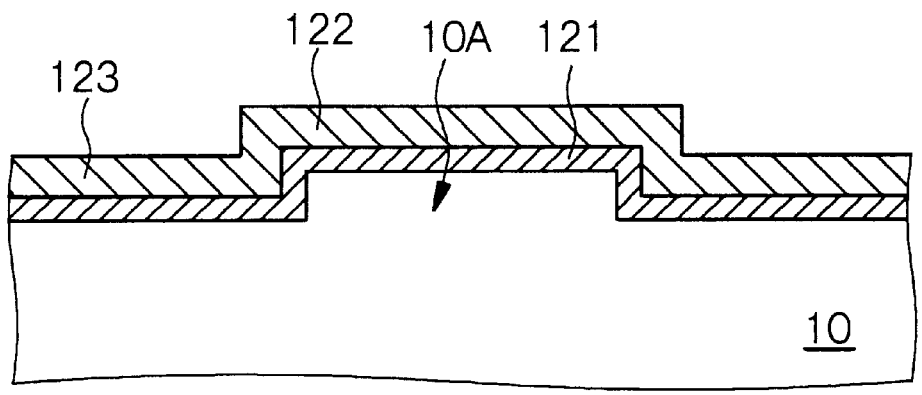
FIGS. 12A and 12B are schematic partial cross-sectional views of a semiconductor substrate, for explaining a process for the production of a conventional semiconductor device.
Figure 12B:
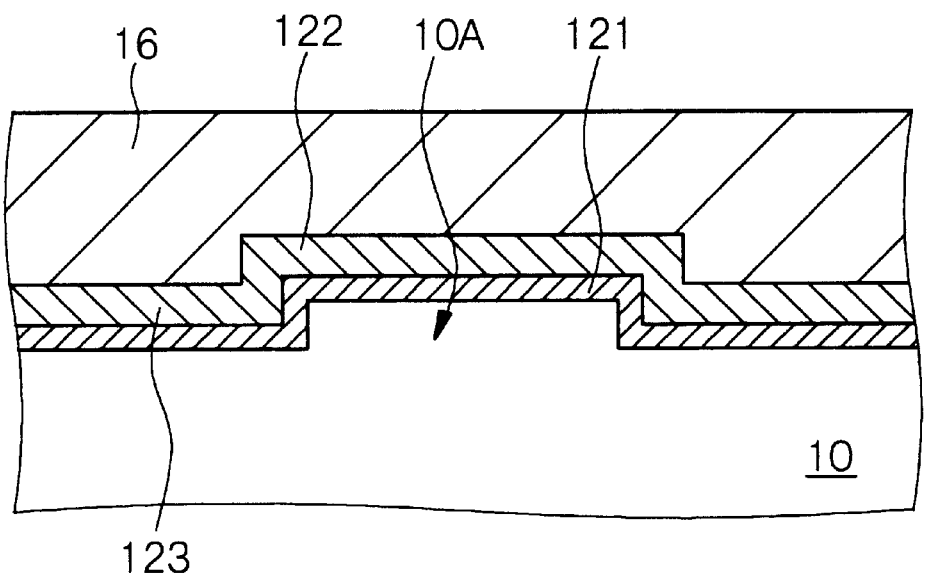
Figure 13A:
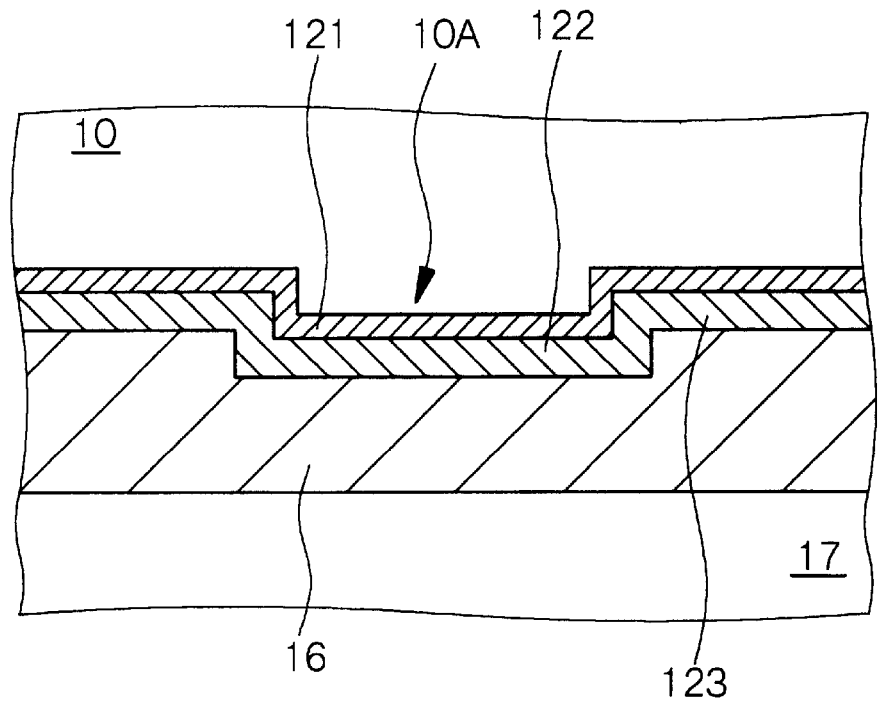
FIGS. 13A and 13B following FIG. 12B are schematic partial cross-sectional views of the semiconductor substrate, for explaining the process for the production of the conventional semiconductor device.
Figure 13B:
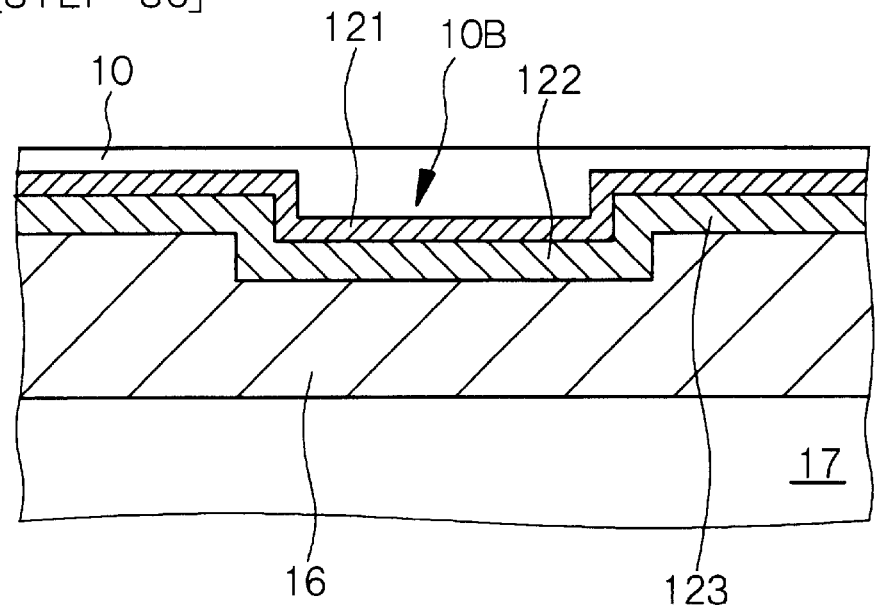
Figure 14A:
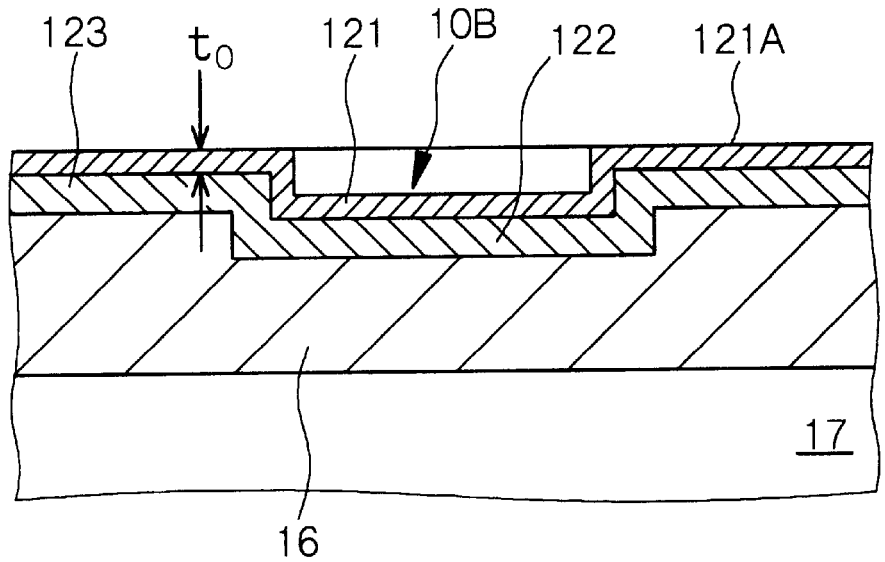
FIGS. 14A and 14B following FIG. 13B are schematic partial cross-sectional views of the semiconductor substrate, for explaining the process for the production of the conventional semiconductor device.
Figure 14B:
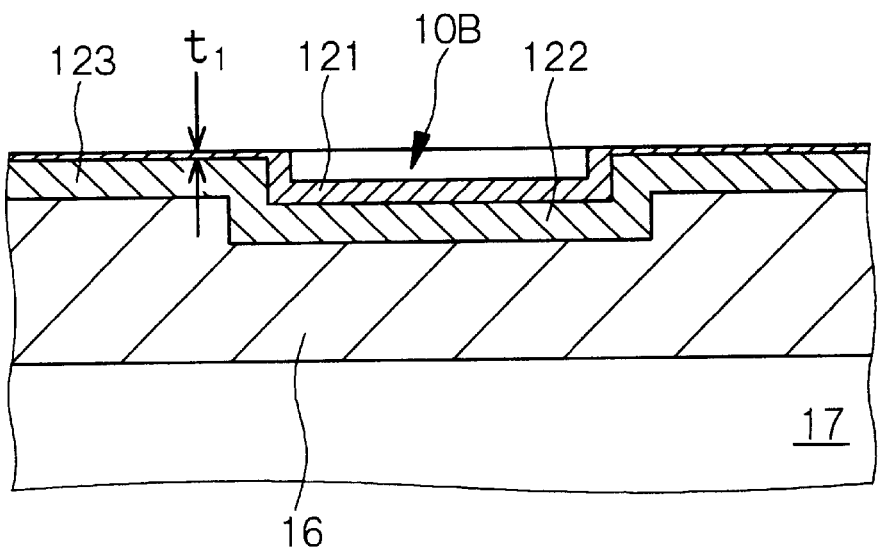
Figure 15:
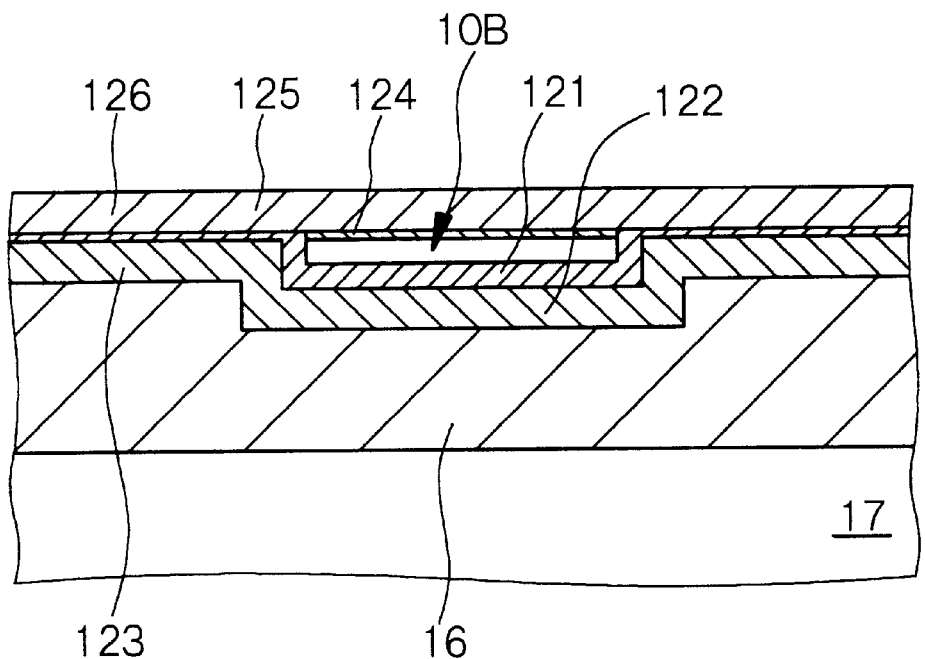
FIG. 15 following

Then, as seen in FIGS. 10B and 11, a sacrificial oxide layer is formed on the surface of the semiconductive layer 10B by a thermal oxidation method, an ion-implanting mask is formed from a resist material, and the semiconductive layer 10B is ion-implanted for controlling a threshold voltage. Then, the sacrificial oxide layer is removed with hydrofluoric acid. When the sacrificial oxide layer is removed, the oxide layer 18 is also etched. Since, however, the oxide layer 18 has a sufficient thickness, the remaining oxide layer 18 still has a sufficient thickness. Therefore, an increase in parasitic capacitance in a portion where the first word line and the second word line face each other can be prevented.

Then, a second gate insulating film 24 is formed on an exposed surface of the semiconductive layer 10B by a thermal oxidation method or by a combination of a thermal oxidation method and a thermal nitriding method (see FIG. 10B). A polycrystalline silicon layer containing an impurity is formed on the entire surface by a CVD method, and then, the polycrystalline silicon layer is patterned to form a second gate electrode 25 on the second insulating film 24. At the same time, a second word line 26 extending from the second gate electrode 25 is formed on the oxide layer 18. In this manner, a structure shown in FIG. 11 can be obtained.

[Step-260]

Then, a MOS-FET is completed by carrying out a step similar to [Step-170] in Example 1.

The present invention has been explained with reference to the two examples hereinabove, while the present invention shall not be limited thereto. The production conditions and the structures of semiconductor devices, explained the examples are given for illustrative purposes, and can be altered in design as required.

In the process for the production of a semiconductor device according to the first or second aspect of the present invention, the insulating film or the oxide layer having a sufficient thickness can be secured, and an increase in parasitic capacitance in a portion where the first word line and the second word line face each other can be prevented. In the process for the production of a semiconductor device according to the first aspect of the present invention, the thickness of the semiconductive layer is defined by the height of the step formed in the semiconductor substrate, so that the degree of freedom of designing the thickness of the semiconductive layer is high, and that the semiconductive layer can be easily formed as one having a thin thickness. In the process for the production of a semiconductor device according to the second aspect of the present invention, the thickness of the oxide layer can be decreased, so that the critical dimension loss of the semiconductive layer caused by the formation of the oxide layer can be relatively minimized. Further, the step is formed in the semiconductor substrate and the surface of the etched portion of the semiconductor substrate is oxidized to form the oxide layer, so that the thickness of the semiconductive layer can be decreased. Further, the second gate electrode and the second word line can be formed on the flat semiconductive layer and on the flat insulating film or oxide layer, so that there can be provided a production process which has no influence on the micro-processing for the second gate electrode and the second word line. As a result, the parasitic capacitance between the first word line and the second word line can be decreased, and there can be accomplished a high speed of performance of a semiconductor device, a decrease in power consumption and a further improvement in integration degree.

What is claimed is:

1. A process for the production of a semiconductor device comprising the steps of;

(a) forming a patterned mask layer on a surface of a semiconductor substrate, said mask layer having a two-layered structure formed of a silicon oxide film and a silicon nitride film on the silicon oxide file, (b) etching the semiconductor substrate using the mask layer as an etching mask, to form a step between a portion of the semiconductor substrate covered with the mask layer and an etched portion of the semiconductor substrate, (c) forming an insulating film on the entire surface, and then planarizing the insulating film to cover the etched portion of the semiconductor substrate with the insulating film, (d) removing the mask layer, then, forming a first gate insulating film on an exposed surface of the semiconductor substrate, then forming a first gate electrode on the first gate insulating film, and at the same time, forming a first word line extending from the first gate electrode on the insulating film, (e) forming an interlayer on the entire surface, and bonding the semiconductor substrate and a supporting substrate to each other through the interlayer, (f) grinding and polishing the semiconductor substrate from its rear surface to expose a bottom surface of the insulating film and to leave a semiconductive layer which is the semiconductor substrate remaining after the polishing, surrounded by the insulating film, and (g) forming a second gate insulating film on an exposed surface of the semiconductive layer, then forming a second gate electrode on the second gate insulating film, and at the same time, forming a second word line extending from the second gate electrode on the insulating film.

2. The process for the production of a semiconductor device according to claim 1, in which the insulating film is a silicon oxide film and is formed by a chemical vapor deposition method.

3. A process for the production of a semiconductor device comprising the steps of;

(a) forming a patterned mask layer on a semiconductor substrate, said mask layer having a two-layered structure formed of a silicon oxide film and a silicon nitride film formed on the silicon oxide film, (b) etching the semiconductor substrate using the mask layer as an etching mask, to form a step between a portion of the semiconductor substrate covered with the mask layer and an etched portion of the semiconductor substrate, (c) selectively oxidizing the surface of the etched portion of the semiconductor substrate to form an oxide layer, (d) removing the mask layer, then, forming a first gate insulating film on an exposed surface of the semiconductor substrate, forming a first gate electrode on the first gate insulating film, and at the same time, forming a first word line extending from the first gate electrode on the oxide layer, (e) forming an interlayer on the entire surface, and bonding the semiconductor substrate and a supporting substrate to each other through the interlayer, (f) grinding and polishing the semiconductor substrate from its rear surface to expose a bottom surface of the oxide layer and to leave a semiconductive layer which is the semiconductor substrate remaining after the polishing, surrounded by the oxide layer, and (g) forming a second gate insulating film on an exposed surface of the semiconductive layer, then forming a second gate electrode on the second gate insulating film, and at the same time, forming a second word line extending from the second gate electrode on the oxide layer.

4. The process for the production of a semiconductor device according to claim 3, in which the oxide layer is formed by carrying out selective thermal oxidation of the surface of the etched portion of the semiconductor substrate.

* * * * *

UNITED STATES PATENT AND TRADEMARK OFFICE
CERTIFICATE OF CORRECTION

PATENT NO. : 6,214,693 B1
DATED : April 10, 2001
INVENTOR(S) : Hiroshi Komatsu

It is certified that error appears in the above-identified patent and that said Letters Patent is hereby corrected as shown below:

<u>Column 11, claim 1,</u>
Line 62, after "oxide" change "file" to -- film --.

Signed and Sealed this

Twenty-sixth Day of February, 2002

Attest:

Attesting Officer

JAMES E. ROGAN
*Director of the United States Patent and Trademark Office*